United States Patent
Ohta

(10) Patent No.: US 7,425,745 B2
(45) Date of Patent: Sep. 16, 2008

(54) SEMICONDUCTOR DEVICE AND METHOD FOR MANUFACTURING THE SAME

(75) Inventor: Sougo Ohta, Tonami (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/055,271

(22) Filed: Feb. 8, 2005

(65) Prior Publication Data

US 2005/0179090 A1    Aug. 18, 2005

(30) Foreign Application Priority Data

Feb. 16, 2004    (JP) ............... 2004-038909

(51) Int. Cl.
*H01L 29/72* (2006.01)

(52) U.S. Cl. .......... 257/368; 257/401; 257/446; 257/466; 257/509; 257/618; 257/773; 257/778

(58) Field of Classification Search ........ 257/368, 257/401, 446, 466, 509, 618, 773, 778
See application file for complete search history.

(56) References Cited

U.S. PATENT DOCUMENTS

| | | | |
|---|---|---|---|
| 6,025,270 A | 2/2000 | Yoo | |
| 6,333,205 B1 | 12/2001 | Rhodes | |
| 6,492,668 B2 | 12/2002 | Maeda | |
| 6,521,926 B1 * | 2/2003 | Sasaki | 257/292 |
| 6,583,438 B1 | 6/2003 | Uchida | |
| 6,617,241 B1 | 9/2003 | Doan | |
| 2003/0216022 A1 * | 11/2003 | Mayuzumi | 438/595 |
| 2003/0234432 A1 | 12/2003 | Song et al. | |

FOREIGN PATENT DOCUMENTS

| | | |
|---|---|---|
| EP | 1 139 428 | 10/2001 |
| JP | 4-12568 | 1/1992 |
| JP | 2000-357786 | 12/2000 |
| JP | 2002-190586 | 7/2002 |
| KR | 1998-0084299 | 12/1998 |
| KR | 2001-0093670 | 10/2001 |
| KR | 2003-097648 | 12/2003 |

* cited by examiner

*Primary Examiner*—Edward Wojciechowicz
(74) *Attorney, Agent, or Firm*—Hamre, Schumann, Mueller & Larson, P.C.

(57) ABSTRACT

A semiconductor device includes a semiconductor substrate, an isolation film that is provided in one principal surface of the semiconductor substrate, wiring that is arranged on the isolation film, a diffusion layer that is formed inside the semiconductor substrate and located in the vicinity of the isolation film, and an insulating film that covers the diffusion layer over the one principal surface of the semiconductor substrate. The insulating film further covers a portion of the isolation film near to the diffusion layer and comes into contact with the side of the wiring near to the diffusion layer.

12 Claims, 14 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device such as an image sensor and a method for manufacturing the semiconductor device.

2. Description of the Related Art

In recent semiconductor integrated circuits, silicidation is performed generally to improve the operating speed. In the silicidation, e.g., the surface of a gate electrode and the surface of a diffusion layer (source/drain) of a MOS integrated circuit react with refractory metals such as titanium, cobalt, and nickel to form a silicide. When the surfaces of the gate electrode and the diffusion layer (source/drain) are silicided, the MOS integrated circuit can achieve a lower resistance and a higher operating speed. Along with a demand for improving the device properties or reliability, there is a tendency to separate a region where a silicide is formed from a region where no silicide is formed in one chip. This technique also is used in a semiconductor device with a smaller chip size such as an image sensor.

FIG. 14 is a schematic view showing an example of the configuration of an image sensor. The image sensor includes a semiconductor substrate 200, a pixel region 202, and peripheral circuit regions 203. The pixel region 202 and the peripheral circuit regions 203 are formed on the semiconductor substrate 200. The peripheral circuit regions 203 include a driving circuit for driving the pixel region 202, a signal processing circuit, and the like. Each of the driving circuit, the signal processing circuit, and the like includes a FET (field-effect transistor) with a MOS structure. The pixel region 202 includes a plurality of pixels 201 in a two-dimensional array, and each of the pixels 201 includes a photodiode.

FIG. 15 shows a cross section of the pixel structure. A diffusion layer 116 of an N-type photodiode is provided in a P-type semiconductor substrate 200. A transfer gate 117 of a MOS transistor is formed in the vicinity of the diffusion layer 116. In FIG. 15, an N-type diffusion layer (floating diffusion amplifier) 118 is located near to the opposite side of the transfer gate 117 from the diffusion layer 116. An isolation film 104 is located near to the opposite side of the diffusion layer 116 from the transfer gate 117. The isolation film 104 is provided in the semiconductor substrate 200. Wiring 101 is formed on the isolation film 104. A polysilicon film is used mainly for both the transfer gate 117 and the wiring 101.

In recent years, the pixel size (i.e., the area of a pixel) of an image sensor has become progressively smaller so that the image sensor can be installed, e.g., in a cellular phone or digital still camera. Moreover, each pixel 201 (FIG. 14) requires a sidewall spacer 103 that is in contact with a side of the wiring 101 in addition to the diffusion layer 116 of the photodiode, the transfer gate 117, and the wiring 101.

The structure of the sidewall spacer 103 is the same as that of a sidewall spacer of the MOS transistor in the peripheral circuit region 203 (FIG. 14). The MOS transistor in the peripheral circuit region 203 (FIG. 14) employ a LDD (lightly doped drain) structure and thus can suppress degradation caused by hot carriers.

In each pixel 201 (FIG. 14), a silicide layer 105 is formed to reduce a resistance of the transfer gate 117 or the wiring 101. The silicide layer 105 is formed not only on the surfaces of the wiring 101 and the transfer gate 117, but also on the source/drain surfaces (not shown in FIG. 15) of the transistor (except for the transfer gate 117) of the pixel and the transistor of the peripheral circuit region 203 (FIG. 14).

It is well known that the sidewall spacer 103 can be formed in the following manner: a $SiO_2$ insulating film is formed on the transfer gate 117 and the wiring 101, and then the insulating film is etched back by anisotropic etching. The anisotropic etching is performed while an insulating film 102 that is arranged directly above the diffusion layer 116 is covered with a resist pattern so as to avoid the formation of a damaged layer in the diffusion layer 116 due to etching (see, e.g., JP 2002-190586 A). When a damaged layer is formed in the diffusion layer 116, a part ($\Delta Q$) of charge (Q) that has been generated by photoelectric conversion and stored in the diffusion layer 116 is lost as a leakage current. Consequently, the saturation characteristics such as the sensitivity of an image sensor are reduced, which in turn degrades the pixel characteristics of the image sensor.

Next, a method for manufacturing the image sensor will be described specifically with reference to FIGS. 16 and 17. FIG. 16 shows the state before an insulating film 108 is etched back by anisotropic etching. FIG. 17 shows the state after an insulating film 108 is etched back by anisotropic etching. In this case, FIGS. 16 and 17 are enlarged cross-sectional views of the wiring 101 and its surroundings in a pixel of the conventional image sensor as shown in FIG. 15.

As shown in FIG. 16, a resist pattern 110 is formed as a mask on the insulating film 108 so as not to cover the wiring 101 and a portion of the insulating film 108 that serves as a sidewall spacer 108b (FIG. 17). The layout of a photomask for forming the resist pattern 110 is designed in view of an alignment deviation (error) of the photomask. Specifically, the alignment deviation includes deviations of the photomask toward the wiring 101 and toward the diffusion layer 116. Therefore, as shown in FIG. 17, the isolation film 104 is large enough to ensure a margin 106 and a margin 107.

However, such an increase in size of the isolation film 104 to ensure the margins 106, 107 makes the diffusion layer 116 of the photodiode smaller. As the diffusion layer 116 of the photodiode is reduced in size, the amount of charge generated by photoelectric conversion in the diffusion layer 116 is reduced, which interferes with an improvement (higher performance) of image sensitivity. Moreover, it is necessary to avoid etching damage to the diffusion layer 116 during anisotropic etching. Therefore, the conventional method, in which the resist pattern 110 is formed so as not to cover the wiring 101 and a portion of the insulating film 108 that serves as the sidewall spacer 108b (FIG. 17), cannot place the diffusion layer 116 closer to the isolation film 104 to miniaturize the image sensor further. Thus, it is difficult for the conventional image sensor to achieve a smaller size and higher performance.

The above problems are not specific to the conventional image sensor, but common to other semiconductor devices including a sidewall spacer and a diffusion layer located in the vicinity of the sidewall spacer.

SUMMARY OF THE INVENTION

A semiconductor device of the present invention includes the following: a semiconductor substrate; an isolation film that is provided in one principal surface of the semiconductor substrate; wiring that is arranged on the isolation film; a diffusion layer that is formed inside the semiconductor substrate and located in the vicinity of the isolation film; and an insulating film that covers the diffusion layer over the one principal surface of the semiconductor substrate. The insulating film further covers a portion of the isolation film near to the diffusion layer and comes into contact with the side of the wiring near to the diffusion layer.

A method for manufacturing a semiconductor device of the present invention includes a step (a) of forming an isolation film on one principal surface of a semiconductor substrate, forming wiring on the isolation film, forming a diffusion layer in the vicinity of the isolation film by injecting impurity ions into the semiconductor substrate, and forming an insulating film on the one principal surface of the semiconductor substrate so as to cover at least the isolation film, the wiring, and the diffusion layer; and a step (b) of forming a resist pattern on the insulating film, removing a part of the insulating film by anisotropic etching while using the resist pattern as a mask, and exposing at least a part of the wiring. When a portion of the insulating film that lies directly on the wiring is identified as a first portion, and a stepped portion of the insulating film that lies next to the first portion, has a surface including a rounded surface, and is located on a portion of the wiring-side surface of the isolation film that is on the same side of the wiring as the diffusion layer is identified as a second portion, the resist pattern is formed on the insulating film so as to cover a region including at least a part of the second portion and a portion of the insulating film that is arranged directly above the diffusion layer while avoiding at least a part of the first portion in the step (b).

According to the semiconductor device and the manufacturing method thereof, e.g., even if the isolation film is formed in a smaller region and the diffusion layer is formed in a larger region of the semiconductor substrate, it is possible to avoid etching damage to the diffusion layer. Moreover, even if the diffusion layer is located closer to the isolation film, it is also possible to avoid etching damage to the diffusion layer. Thus, the present invention can achieve the miniaturization or high performance of a semiconductor device.

In this specification, the side of the wiring indicates a surface that defines the thickness of the wiring.

DESCRIPTION OF THE PREFERRED EMBODIMENTS

Hereinafter, embodiments of the present invention will be described with reference to the drawings.

Embodiment 1

Figure 6:
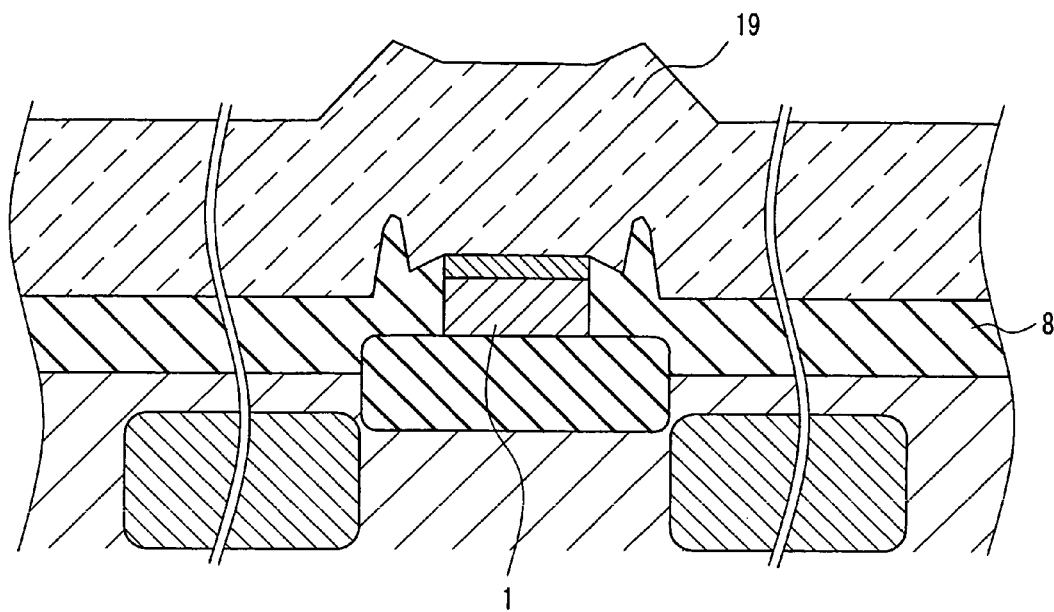
FIG. 6 is a cross-sectional view showing an example of one step in a method for manufacturing a semiconductor device of Embodiment 1.
Figure 7:
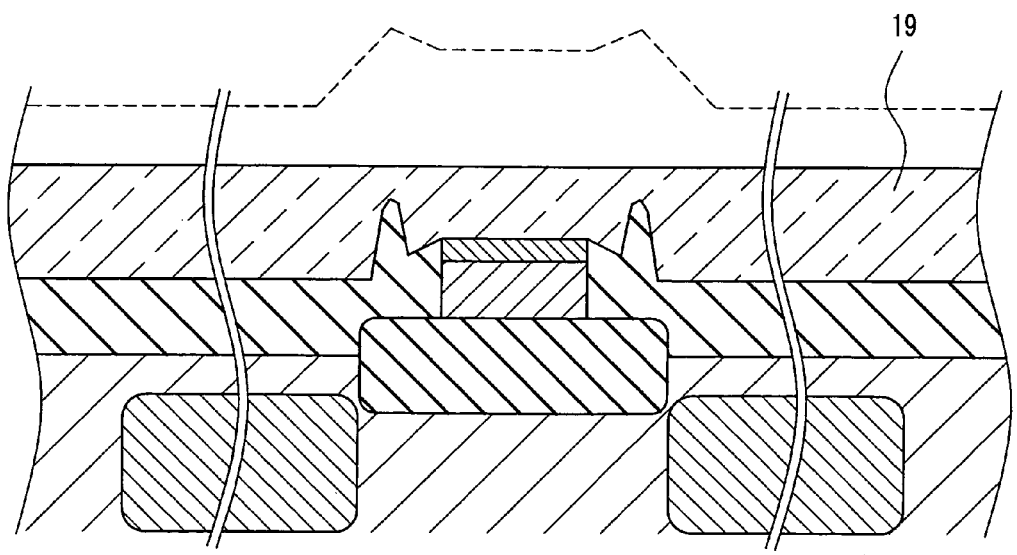
FIG. 7 is a cross-sectional view showing an example of one step in a method for manufacturing a semiconductor device of Embodiment 1.
Figure 8:
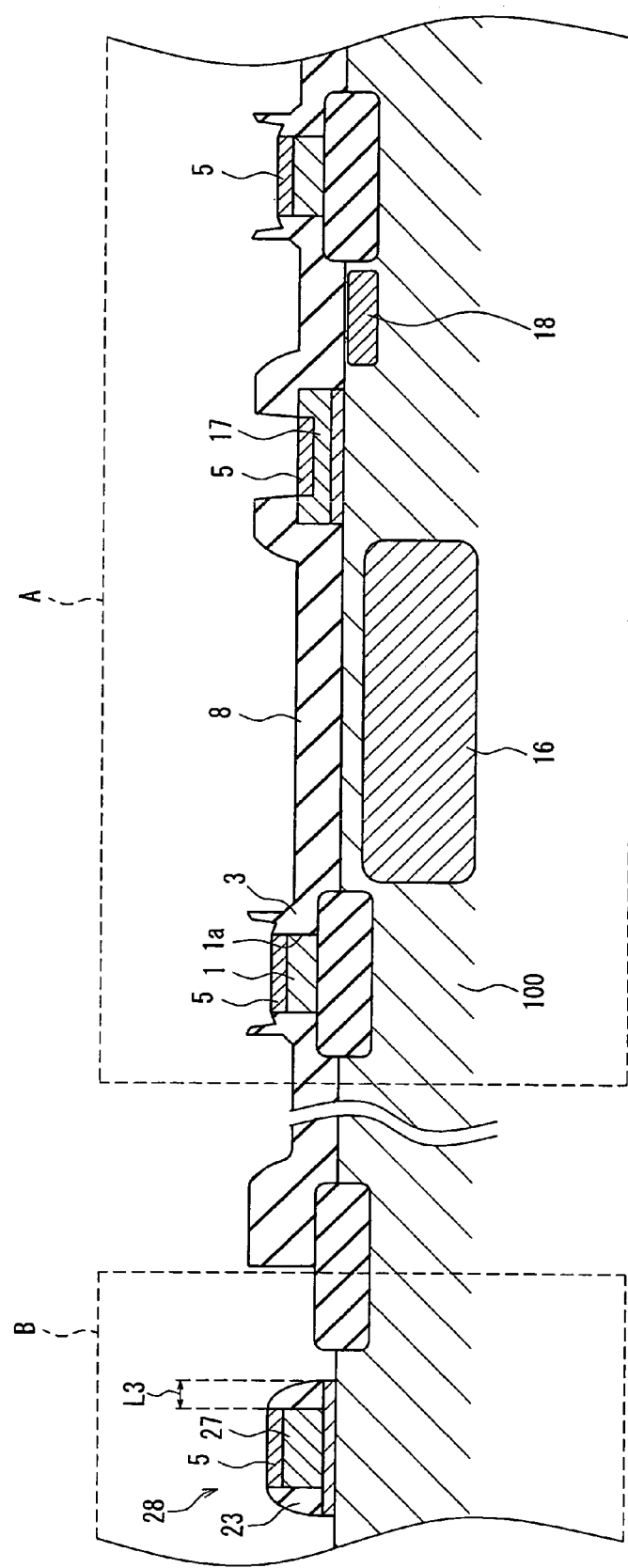
FIG. 8 is a cross-sectional view showing an example of one step in a method for manufacturing a semiconductor device of Embodiment 1.
Figure 14:
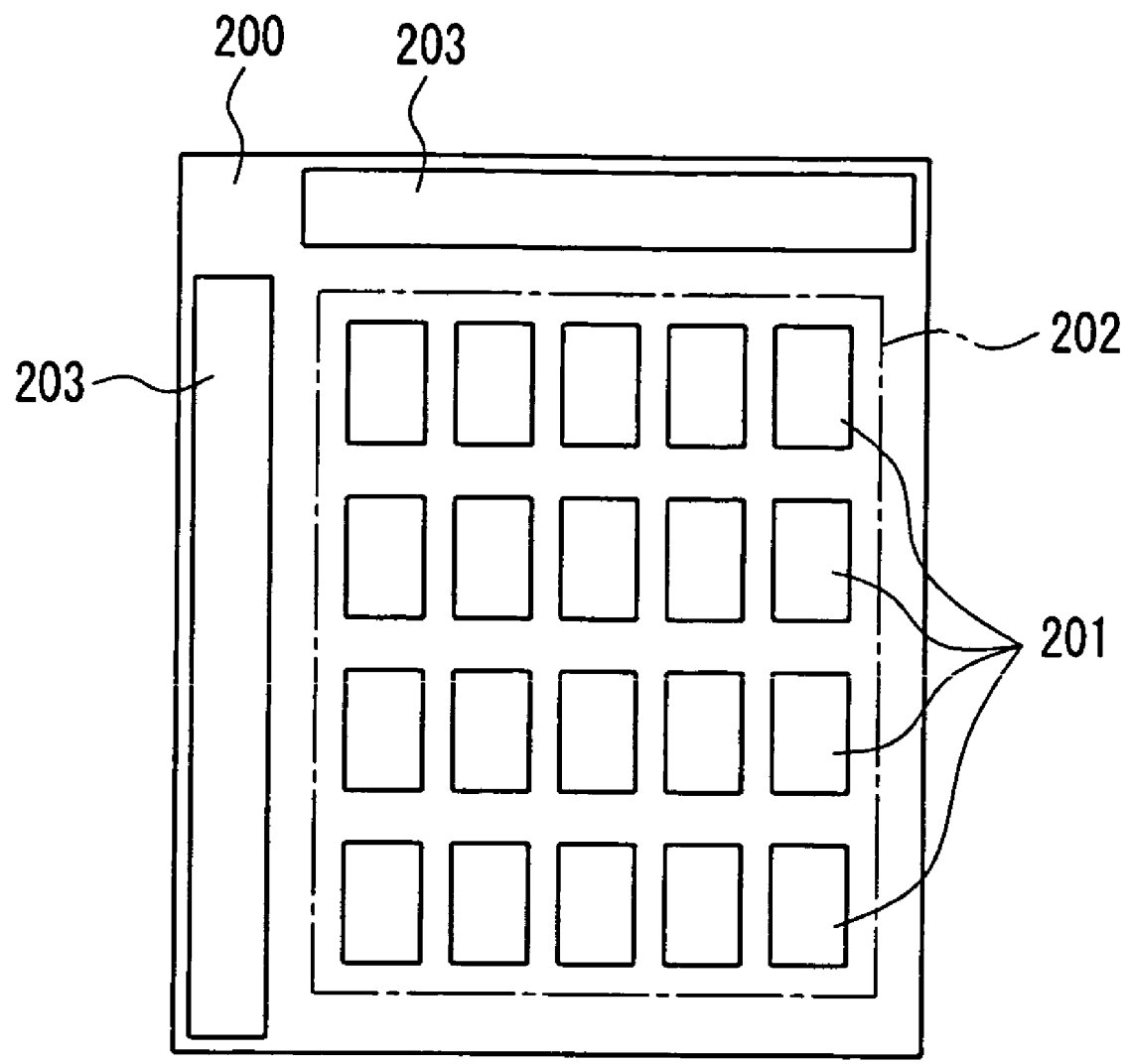
FIG. 14 is a schematic view showing the configuration of a conventional image sensor.
Figure 15:
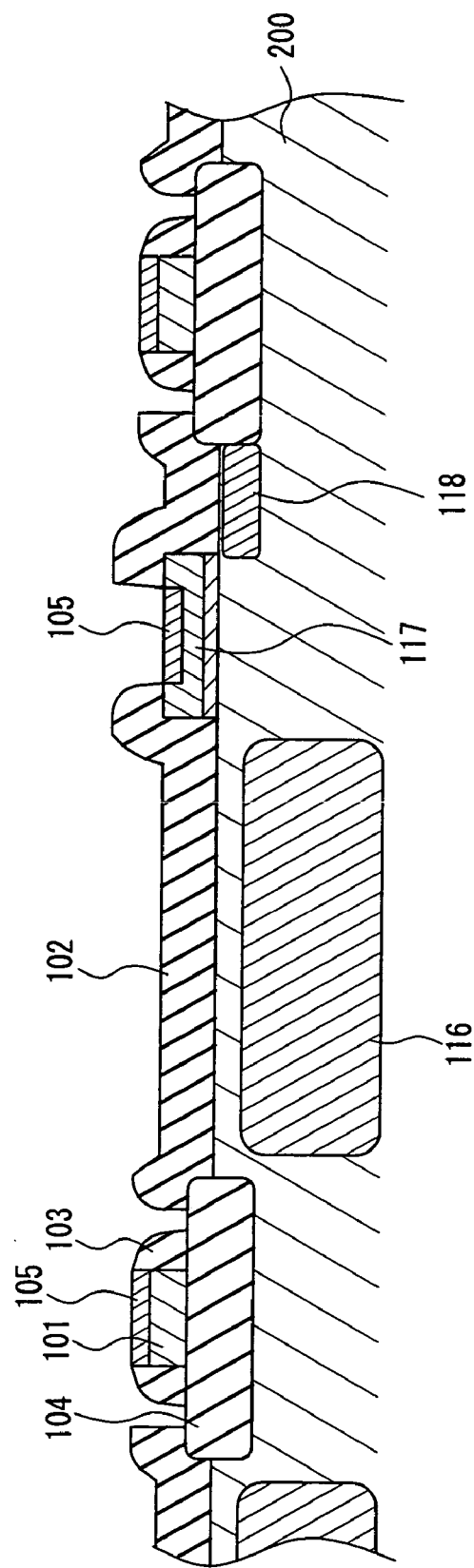
FIG. 15 is a cross-sectional view showing pixels of a conventional image sensor.
Figure 16:
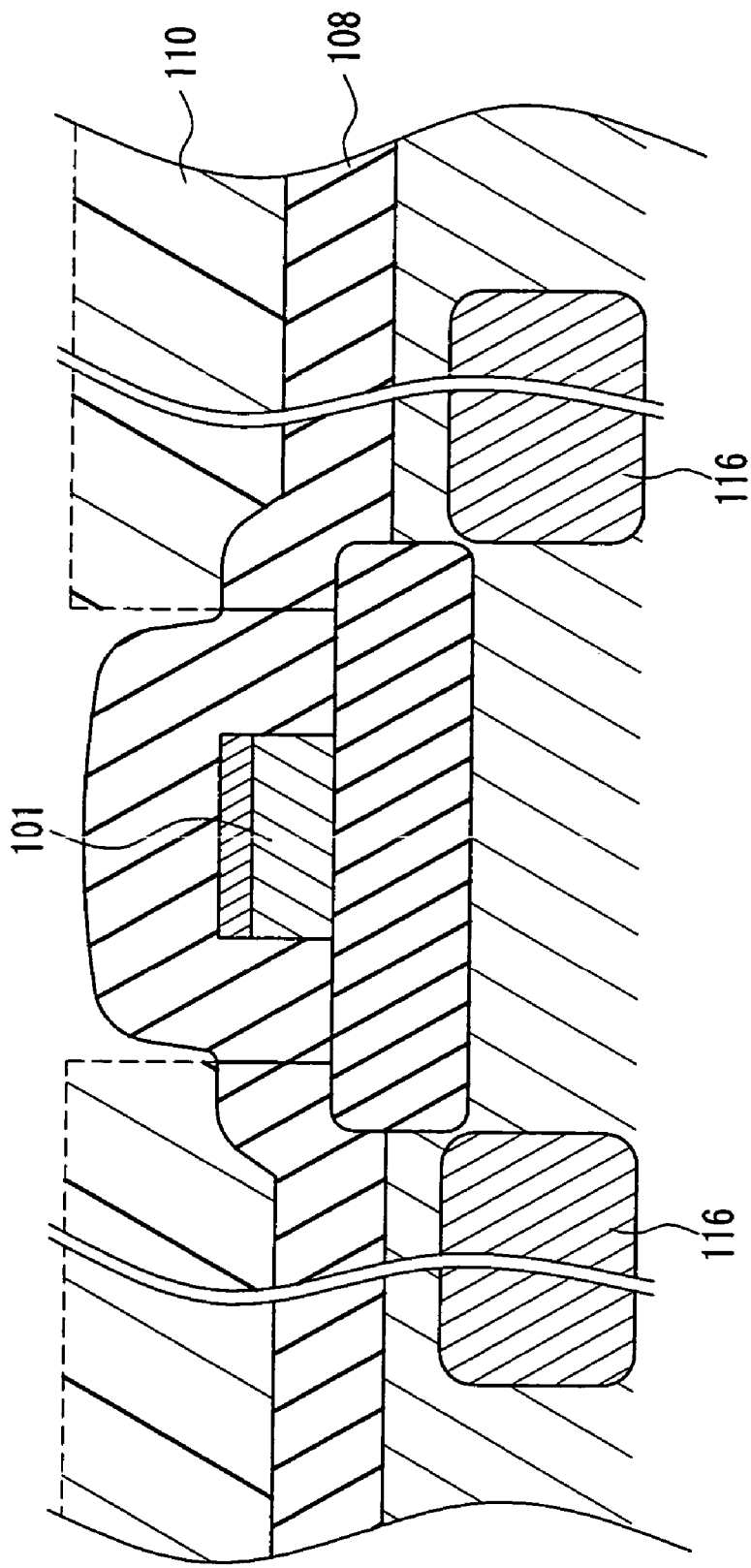
FIG. 16 is a cross-sectional view showing a state of wiring and its surroundings in the pixel in FIG. 15 before an insulating layer is etched back by anisotropic etching.
Figure 17:
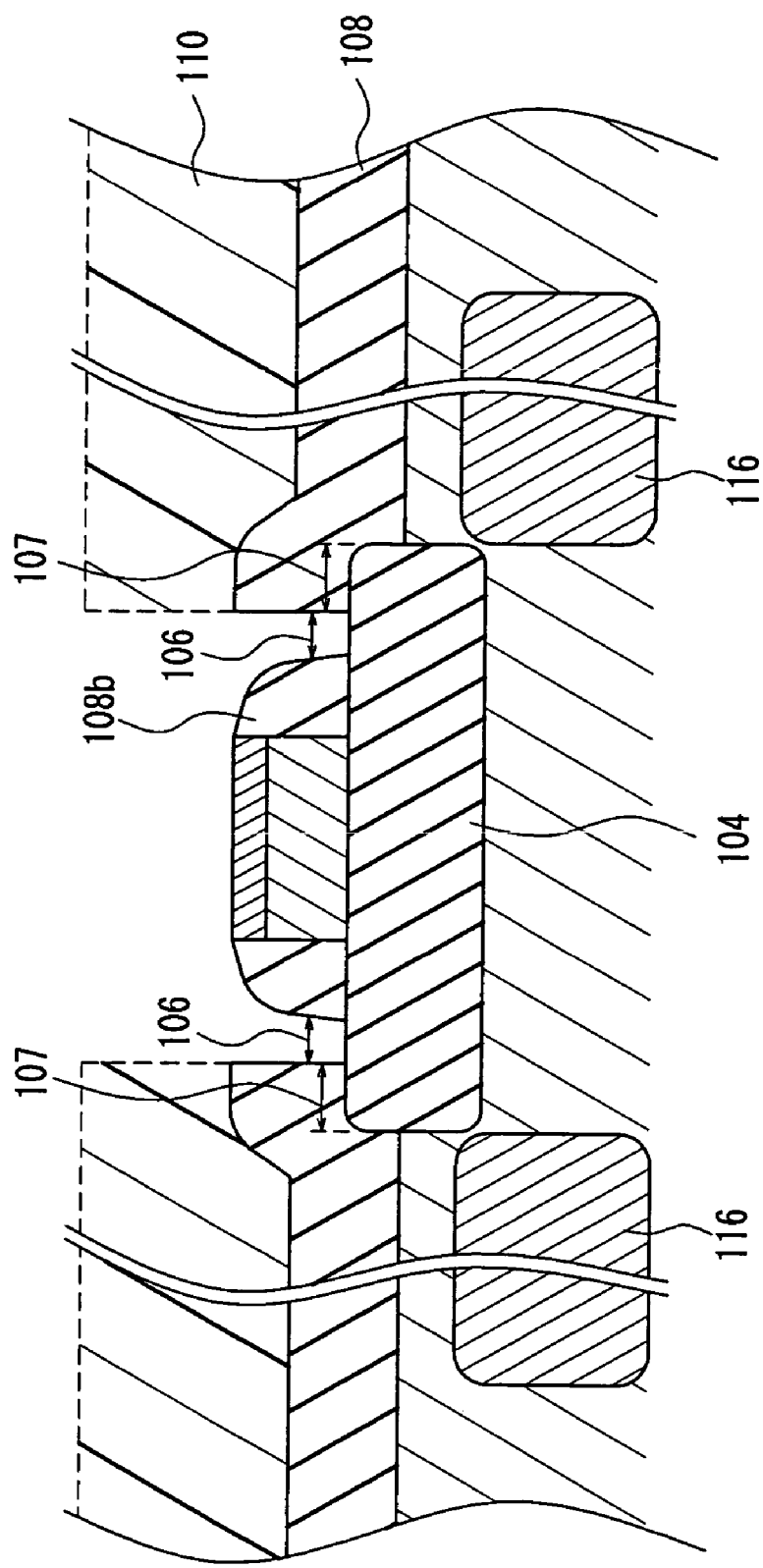
FIG. 17 is a cross-sectional view showing a state of wiring and its surroundings in the pixel in FIG. 15 after an insulating layer is etched back by anisotropic etching.

FIGS. 1 to 8 are cross-sectional views, each showing an example of one step in a method for manufacturing a semiconductor device of the present invention. Specifically, the semiconductor device of this embodiment is an image sensor that includes a pixel region 202 with a plurality of pixels 201 and peripheral circuit regions 203 including a driving circuit for driving the pixel region 202 (FIG. 14). FIGS. 1 to 7 illustrate the manufacturing method for the wiring and its surroundings included in each pixel 201. The other configurations of the pixel 201 are the same as those of a pixel of the conventional image sensor as shown in FIG. 15. FIG. 8 illustrates a part of the pixel region and a part of the peripheral circuit region immediately after silicidation.

Figure 1:
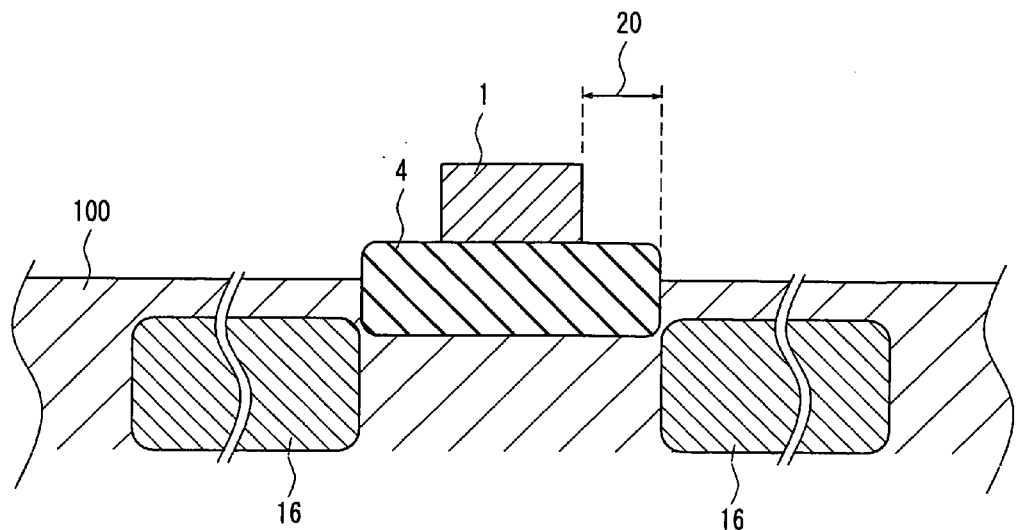
FIG. 1 is a cross-sectional view showing an example of one step in a method for manufacturing a semiconductor device of Embodiment 1.

In the manufacturing method for a semiconductor device of this embodiment, as shown in FIG. 1, an isolation film 4 is formed on a semiconductor substrate 100 by LOCOS (local oxidation of silicon) or STI (shallow trench isolation). The isolation film 4 includes, e.g., $SiO_2$.

Then, a diffusion layer 16 of a photodiode is formed by injecting impurity ions such as arsenic and phosphorus into the semiconductor substrate 100. One end of the photodiode is located in the vicinity of the isolation film 4. The diffusion layer 16 lies slightly inside from one surface of the semiconductor substrate 100. The conductive type of the diffusion layer 16 of the photodiode is opposite to that of the semiconductor substrate 100. For example, when the semiconductor substrate 100 is P-type, the diffusion layer 16 is N-type.

Next, wiring 1 is formed on the isolation film 4 by using, e.g., an N-type conductive polysilicon film. The wiring 1 is formed so that when the wiring 1 and the isolation film 4 are viewed from above the wiring 1, the isolation film 4 can be seen along the entire periphery of the wiring 1. In FIG. 1, a distance 20 between the edge of the wiring 1 near to the diffusion layer 16 and the edge of the isolation film 4 near to the diffusion layer 16 may be, e.g., 0.1 μm.

Further, a gate electrode 27 of a MOS transistor 28 is formed in a portion of one principal surface of the semiconductor substrate 100 that serves as a peripheral circuit region B (FIG. 8).

Figure 2:
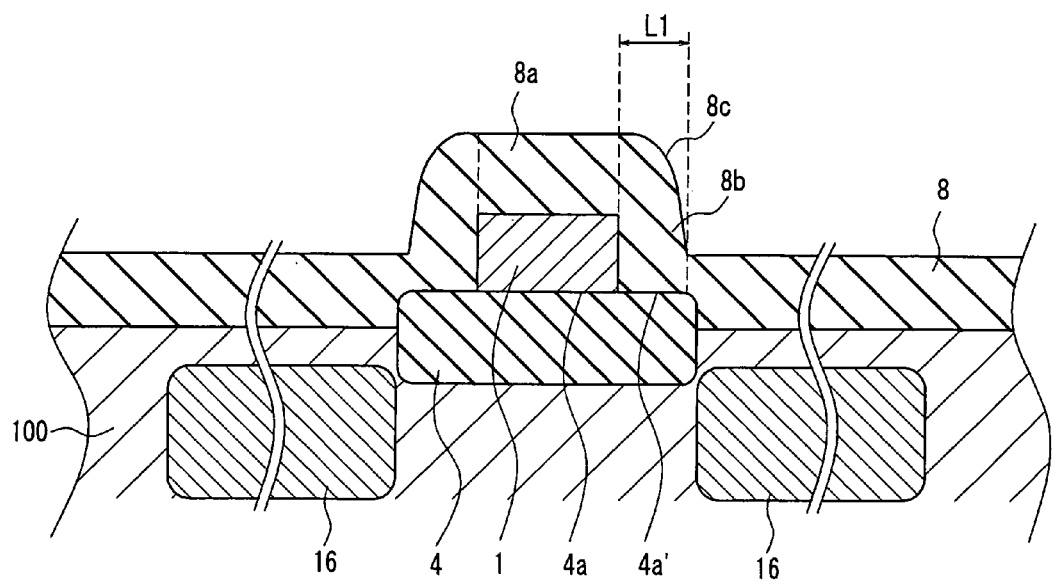
FIG. 2 is a cross-sectional view showing an example of one step in a method for manufacturing a semiconductor device of Embodiment 1.

Next, as shown in FIG. 2, an insulating film 8 is formed so as to cover the isolation film 4, the wiring 1, and the diffusion layer 16. The insulating film 8 may cover, e.g., the entire surface of one principal surface of the semiconductor substrate 100. Therefore, the gate electrode 27 (FIG. 8) also is covered with the insulating film 8. The insulating film 8 is, e.g., a silicon oxide film and can be formed, e.g., by CVD.

In the following, a portion of the insulating film 8 that lies directly on the wiring 1 may be referred to as a "first portion 8a", and a stepped portion of the insulating film 8 that lies next to the first portion 8a and has a surface including a rounded surface 8c may be referred to as a "second portion 8b". The second portion 8b is located on a portion 4a' of the wiring-side surface 4a of the isolation film 4 that is on the same side of the wiring 1 as the diffusion layer 16.

Figure 3:
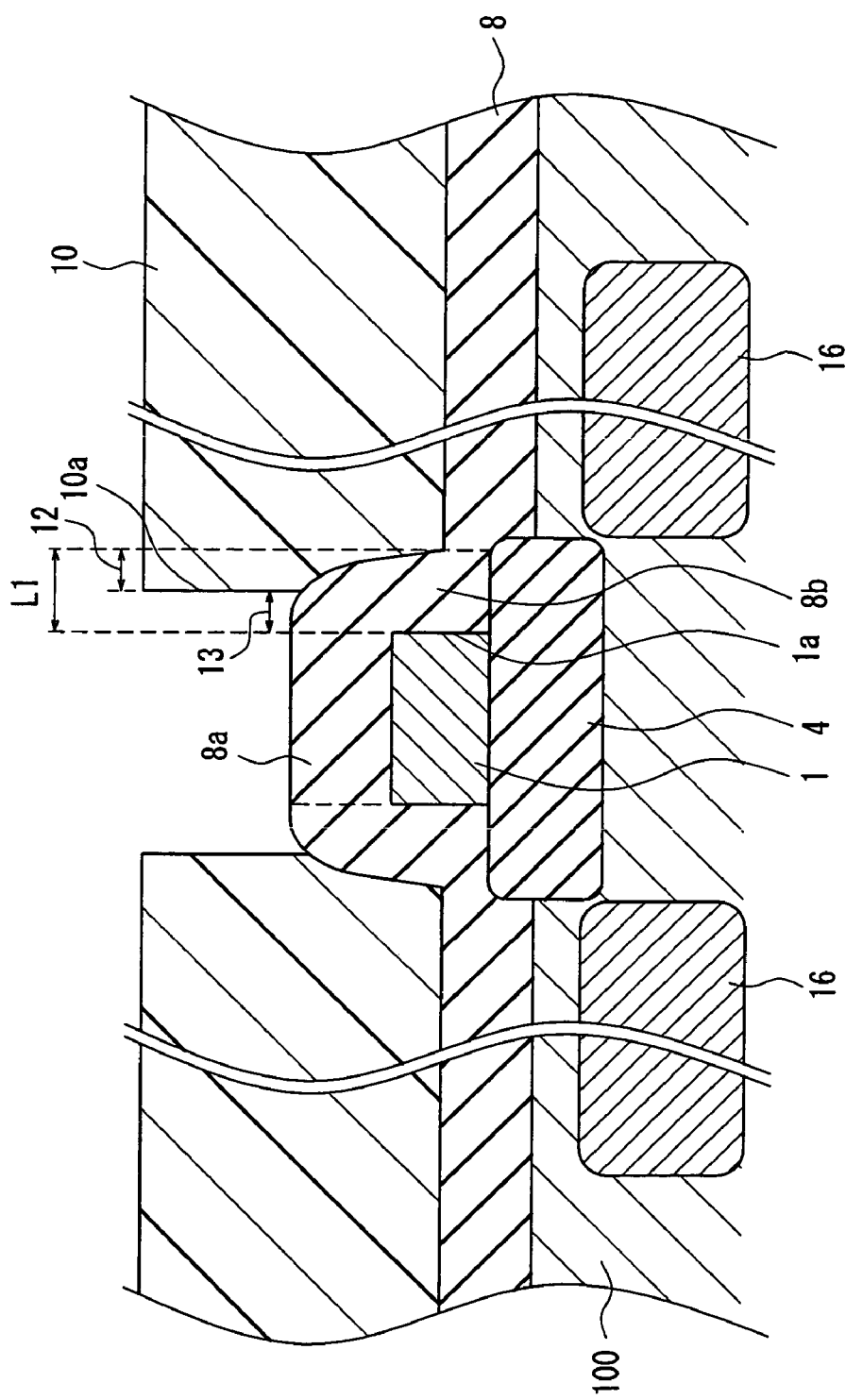
FIG. 3 is a cross-sectional view showing an example of one step in a method for manufacturing a semiconductor device of Embodiment 1.

As shown in FIG. 2, it is preferable that the thickness of the insulating film 8 is determined so that a width L1 of the second portion 8b (stepped portion) is at least two times as long as the alignment accuracy (deviation) of a photomask used for forming a resist pattern 10 (FIG. 3). When the width L1 of the second portion 8b is at least two times as long as the alignment accuracy of the photomask, the resist pattern 10 (FIG. 3) can be formed with its edge 10a on the second portion 8b, even if a shift of the edge 10a toward the wiring 1 or the diffusion layer 16 (on the right side of FIG. 3) is the maximum due to the alignment deviation of the photomask.

The width L1 of the second portion 8b is the same as a width L2 (FIG. 4) of a sidewall spacer 3 that is formed in an etching process, which will be described later.

Next, as shown in FIG. 3, the resist pattern 10 is formed on the insulating film 8. The resist pattern 10 is formed so as to cover a region including a part of the second portion 8b and a portion of the insulating film 8 that is arranged directly above the diffusion layer 16 while avoiding a region on the first portion 8a of the insulating film 8. The resist pattern 10 protects the diffusion layer 16 from plasma in the subsequent etching process.

It is preferable that a layout of the photomask used for forming the resist pattern 10 is designed so that the edge 10a of the resist pattern 10 is positioned at one-half the width L1 of the second portion 8b (stepped portion). When the width L1 of the second portion 8b is at least two times as long as the alignment accuracy of the photomask, the resist pattern 10 can be formed with its edge 10a on the second portion 8b, even if a shift of the edge 10a toward the wiring 1 or the diffusion layer 16 (on the right side of FIG. 3) is the maximum.

For example, when the alignment accuracy of the photomask is 100 nm, that is, when the maximum shift of the edge 10a from a desired position is 100 nm, the second portion 8b may have a width L1 of 200 nm. The desired position of the edge 10a may be determined so that, e.g., a distance 12 between the edge 10a and the side of the second portion. 8b near to the diffusion layer 16 is 100 nm, and a distance 13 between the edge 10a and a side 1a of the wiring 1 is 100 nm.

In the manufacturing method for a semiconductor device of this embodiment, even if the alignment deviation of the photomask toward the wiring 1 is the maximum, the edge 10a of the resist pattern 10 is not arranged directly on the wiring 1 (first portion 8a). Therefore, all the insulating film on the wiring 1 (first portion 8a) can be removed in the subsequent etching process, and thus the entire surface of the wiring 1 that faces away from the isolation film 4 can be silicided.

Figure 4:
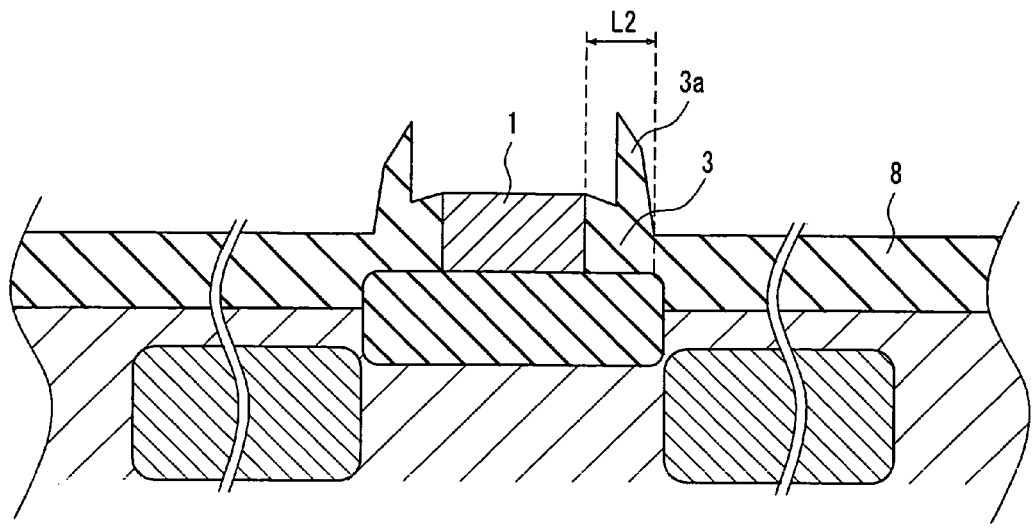
FIG. 4 is a cross-sectional view showing an example of one step in a method for manufacturing a semiconductor device of Embodiment 1.

Next, using the resist pattern 10 as a mask, a part of the insulating film 8 is removed by anisotropic dry etching, so that the surface of the wiring 1 that faces away from the isolation film 4 is exposed, and a sidewall spacer 3 is formed in contact with a side of the wiring 1, as shown in FIG. 4. In this case, a part of the insulating film 8 (second portion 8b) that is formed into the sidewall spacer 3 by etching is covered with the resist pattern 10 (FIG. 3). Therefore, as shown in FIG. 4, the sidewall spacer 3 has a shape made by placing a hornlike portion 3a on a general sidewall spacer (see, e.g., reference numeral 103 in FIG. 15).

At the same time as the removal of a part of the insulating film 8 by anisotropic dry etching so as to expose the wiring 1 and form the sidewall spacer 3, the surface of the gate electrode 27 that faces away from the semiconductor substrate is exposed, and a sidewall spacer 23 is formed in contact with a side of the gate electrode 27 in the peripheral circuit region B, as shown in FIG. 8. The gate electrode 27 constitutes the MOS transistor 28.

The other edge of the resist pattern is arranged closer to the pixel region A from a portion of the insulating film 8 that serves as the sidewall spacer 23. Therefore, the sidewall spacer 23 in contact with the side of the gate electrode 27 has a shape of the general sidewall spacer (see, e.g., reference numeral 103 in FIG. 15). The width L2 (FIG. 4) of the sidewall spacer 3 in contact with the side of the wiring 1 is the same as a width L3 (FIG. 8) of the sidewall spacer 23.

Figure 5:
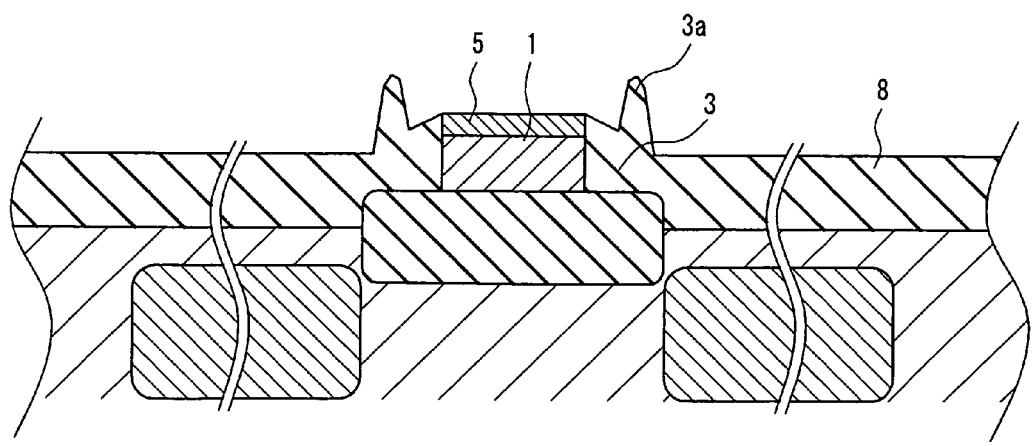
FIG. 5 is a cross-sectional view showing an example of one step in a method for manufacturing a semiconductor device of Embodiment 1.

Next, as shown in FIG. 5, the exposed wiring 1 reacts with a refractory metal to form a silicide 5. The silicide 5 can be formed generally by depositing a metal film of Ti or Co and heating the metal film and the wiring 1. When a portion of the metal film remains unreacted, it may be removed selectively using, e.g., a mixture that includes ammonia and hydrogen peroxide.

The hornlike portion 3a of the sidewall spacer 3, which is formed by the removal of a part of the insulating film by anisotropic etching, becomes gradually smaller when surface cleaning is performed immediately before or after the formation of the silicide 5. Accordingly, the height of the hornlike portion 3a is low enough not to cause any problem. A cleaning agent for the surface cleaning may be, e.g., a mixture including ammonia and hydrogen peroxide, hydrofluoric acid, or the like. In a process of clearing the exposed surface of the wiring 1 with a cleaning agent, a part of the hornlike portion 3a is dissolved by this cleaning agent. Therefore, it is possible to prevent the hornlike portion 3a from interfering with producing a thin semiconductor device. Moreover, the flatness of the insulating film 8 can be improved easily in a subsequent chemical-mechanical polishing (CMP) process. Thus, a pattern also can be formed easily in a lithography process after the CMP process.

FIG. 8 is a cross-sectional view showing a part of the pixel region A and a part of the peripheral circuit region B immediately after the formation of the silicide 5 followed by the surface cleaning. The wiring 1 in FIG. 8 corresponds to the wiring 1 in FIG. 5.

As shown in FIG. 8, the insulating film 8 also covers the end of the transfer gate 17 of the MOS transistor near to the diffusion layer 16. By forming the resist pattern 10 (FIG. 3) to cover the end of the transfer gate 17 near to the diffusion layer 16, the sidewall spacer 3 of the wiring 1, a part of the insulating film 8 that is arranged above the diffusion layer 16, and another part of the insulating film 8 that covers the left end of the transfer gate 17 can be made of one silicon oxide film in FIG. 8. This silicon oxide film continuously covers the semiconductor substrate 100 from the side 1a of the wiring 1 to the end of the transfer gate 17 near to the diffusion layer 16. Further, the transfer gate 17 also is silicided.

When the resist pattern 10 (FIG. 3) is formed so as to cover the end of the transfer gate 17 near to the diffusion layer 16, it is possible to avoid etching damage to the diffusion layer 16, even if, e.g., the diffusion layer 16 is formed in a larger region of the semiconductor substrate 100, or the diffusion layer 16 is located even closer to the transfer gate 17.

Next, as shown in FIG. 6, a BPSG (boron phosphorous silicate glass) film 19 is formed on the silicided wiring 1 and the insulating film 8 by CVD. Subsequently, as shown in FIG. 7, the surface of the BPSG film 19 is flattened by chemical-mechanical polishing (CMP). As the underlying layer of the BPSG film 19 becomes uneven, the unevenness of the BPSG film increases, and flattening of the BPSG film 19 takes a long time.

In this embodiment, the sidewall spacer 3 and a part of the insulating film arranged above the diffusion layer 16 (FIG. 8) are made of one continuous silicon oxide film. Therefore, the unevenness of the underlying layer of the BPSG film is smaller as compared with, e.g., the conventional example in FIG. 15 where the sidewall spacer 103 is separated from the insulating film 102 that is arranged so as to cover the diffusion layer 116. Thus, the BPSG film also can be flattened easily. The subsequent processes are the same as those in a conventional example (see, e.g., JP 4(1992)-12568 A or JP 2000-357786 A).

As described above, in the manufacturing method for a semiconductor device of this embodiment, the insulating film 8 is formed so as to cover at least the wiring 1, the isolation film 4, and the diffusion layer 16 of the photodiode (FIG. 2), and then the resist pattern 10 is formed on the insulating film 8 so as to cover the region including at least a part of the second portion 8b and a portion of the insulating film 8 that is arranged directly above the diffusion layer 16 while avoiding at least a part of the region on the first portion 8a (FIG. 3). Therefore, e.g., even if the isolation film 4 is formed in a smaller region and the diffusion layer 16 is formed in a larger region of the semiconductor substrate 100, it is possible to avoid etching damage to the diffusion layer 16. Moreover, even if the diffusion layer 16 is located closer to the isolation film 4, it is also possible to avoid etching damage to the diffusion layer 16.

Thus, the manufacturing method for a semiconductor device of this embodiment can achieve the miniaturization or high performance of a semiconductor device. For example, when the semiconductor device is an image sensor, the image sensor can have excellent sensitivity to incident light signals.

Figure 13:
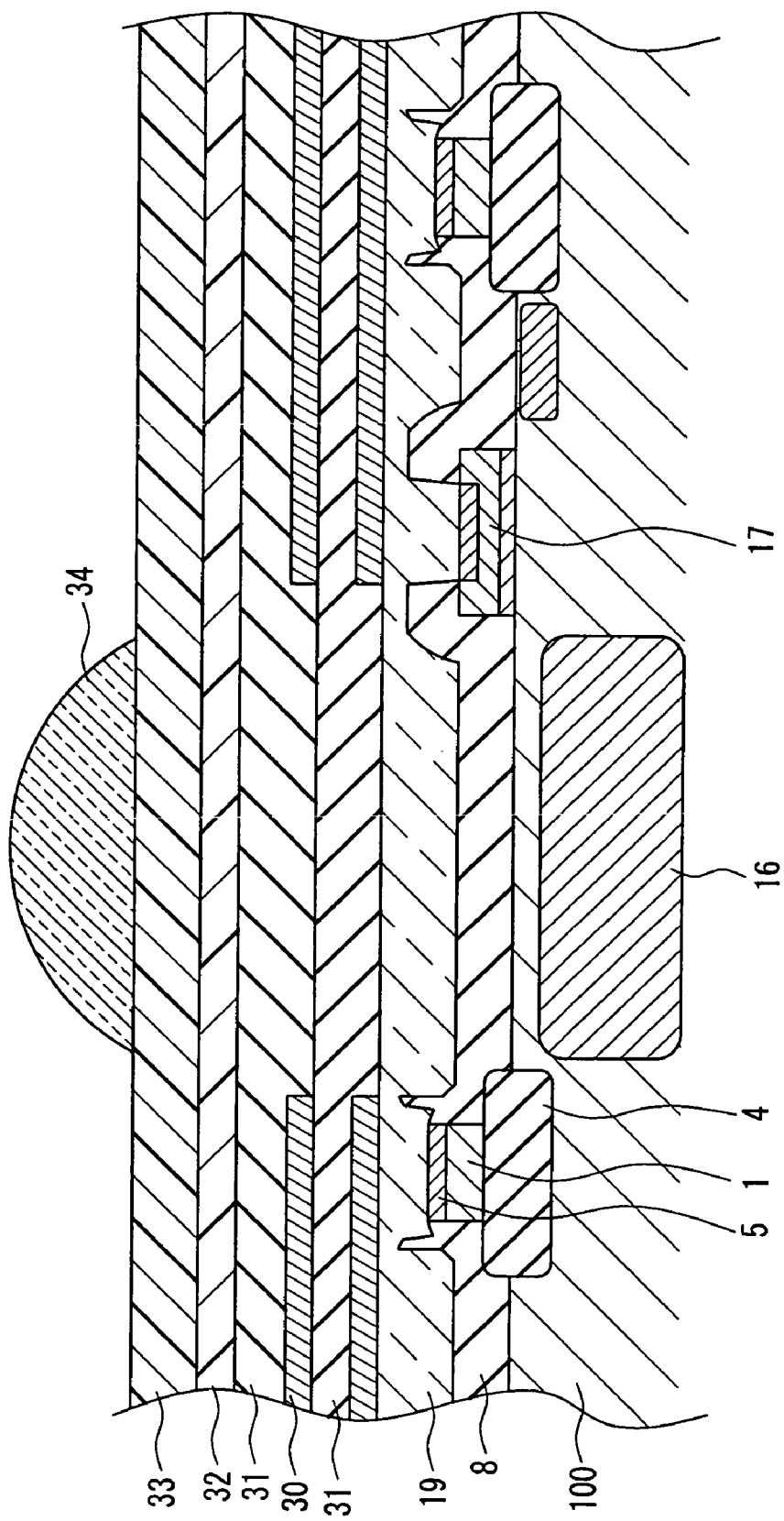
FIG. 13 is a cross-sectional view showing an example of the configuration of a semiconductor device of the present invention.

FIG. 13 shows a semiconductor device manufactured by the method of this embodiment. As shown in FIG. 13, the semiconductor device of this embodiment includes a semiconductor substrate 100, an isolation film 4 that is provided in one principal surface of the semiconductor substrate 100, wiring 1 that is arranged on the isolation film 4, a diffusion layer 16 that is formed inside the semiconductor substrate and located in the vicinity of the isolation film 4, and an insulating film 8 that covers the diffusion layer 16 over the one principal surface of the semiconductor substrate 100. In this case, the vicinity may be a region where the leakage characteristics of the diffusion layer 16 as a photodiode are not affected by the isolation film 4, and the dynamic range of the photodiode is not lower than a predetermined value.

The semiconductor device in FIG. 13 is an image sensor that includes a pixel region 202 with a plurality of pixels 201 and peripheral circuit regions 203 including a driving circuit for driving the pixel region 202 (FIG. 14). In FIG. 13, the diffusion layer 16 serves as a diffusion layer of a photodiode included in a pixel, and the wiring 1 serves as wiring included in the pixel. A transfer gate 17 is provided on one principal surface of the semiconductor substrate 100 in the pixel. The transfer gate 17 is located on the opposite side of the diffusion layer 16 from the wiring 1.

In FIG. 13, reference numeral 5 is a silicide, 19 is a BPSG film, 30 is a metal layer, 31 is a protective film (passivation film), 32 is an acrylic layer, 33 is a color filter, and 34 is a microlens.

The insulating film 8 covers not only a portion directly above the diffusion layer 16, but also a portion of the isolation film 4 near to the diffusion layer 16 and comes into contact with the side of the wiring 1 near to the diffusion layer 16. In the example as shown in FIG. 13, the insulating film 8 covers a portion of the isolation film 4 as well as a portion directly above the diffusion layer 16. The portion of the isolation film 4 is located closer to the diffusion layer 16 than the wiring 1. The insulating film 8 is in contact with one of the sides of the wiring 1 that faces the diffusion layer.

The semiconductor device of this embodiment includes the gate electrode 27 and the sidewall spacer 23 (FIG. 8) that is formed in contact with the side of the gate electrode 27 along with the insulating film 8. Therefore, the insulating film 8 is made of the same material as the sidewall spacer 23 (FIG. 8).

Since the semiconductor device (image sensor) of this embodiment is produced by the above manufacturing method, the degradation of the diffusion layer 16 can be suppressed during the manufacturing process. Thus, the semiconductor device has excellent sensitivity to incident light signals.

As shown in FIG. 13, it is preferable that the insulating film 8 further covers a part of the surface of the transfer gate 17 that faces away from the semiconductor substrate 100. This is because etching damage to the diffusion layer 16 located in the vicinity of the transfer gate 17 can be suppressed during the manufacturing process of the semiconductor device.

In the example as shown in FIG. 13, the insulating film 8 is not formed on the surface of the wiring 1 that faces away from the isolation film 4. However, the semiconductor device of this embodiment is not limited thereto. The insulating film 8 may be formed so as to further cover a part of the surface of the wiring 1 that faces away from the isolation film 4.

Embodiment 2

Figure 9:
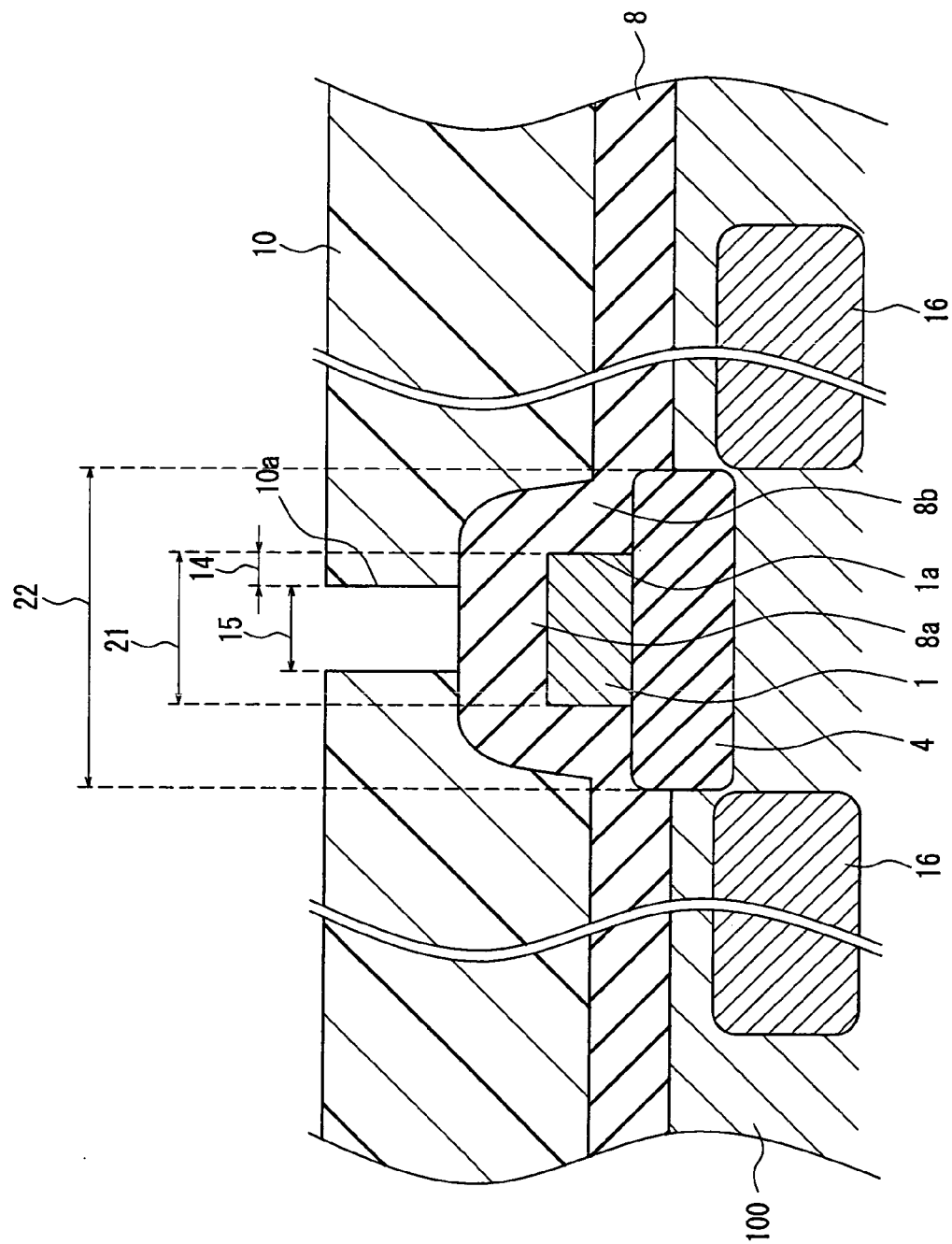
FIG. 9 is a cross-sectional view showing an example of one step in a method for manufacturing a semiconductor device of Embodiment 2.
Figure 10:
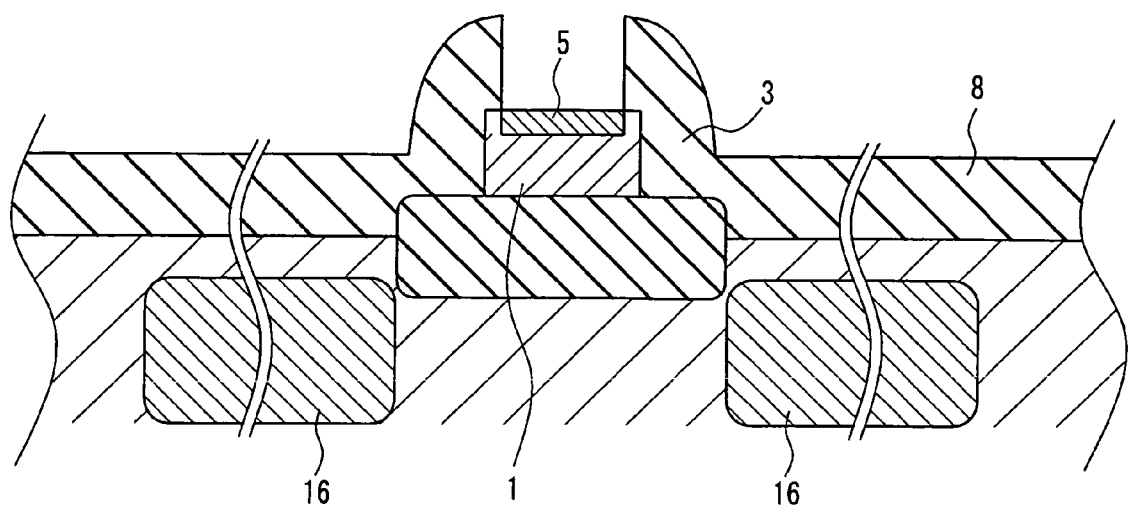
FIG. 10 is a cross-sectional view showing an example of one step in a method for manufacturing a semiconductor device of Embodiment 2.
Figure 11:
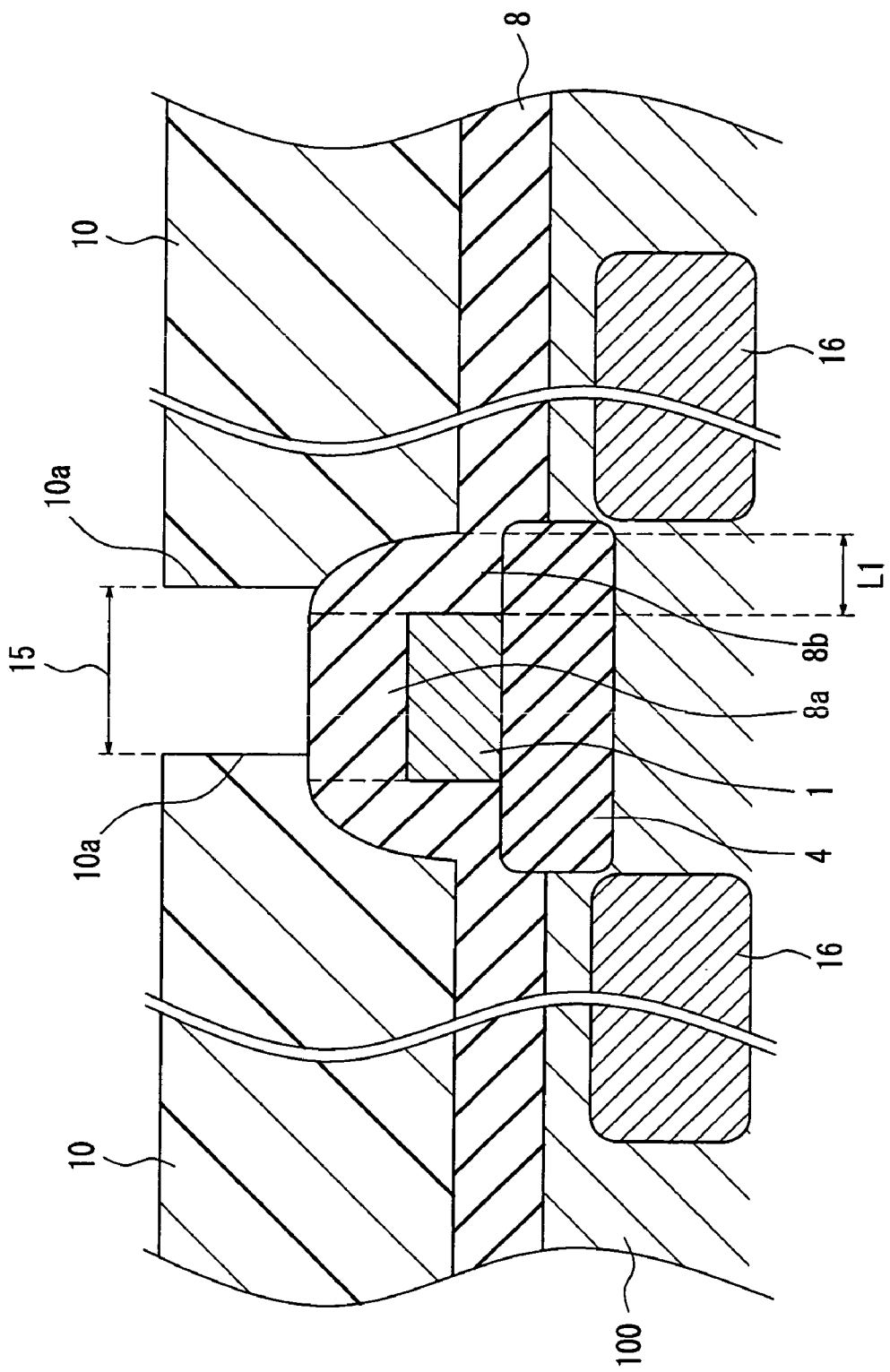
FIG. 11 is a cross-sectional view showing an example of one step in a method for manufacturing a semiconductor device of Embodiment 2.

Referring to FIGS. 9 to 11, another example of a method for manufacturing a semiconductor device of the present invention will be described. Specifically, the method of this embodiment is a method for manufacturing an image sensor that includes a pixel region with a plurality of pixels and a peripheral circuit region including a driving circuit for driving the pixel region.

FIG. 9 shows a process of forming a resist pattern, and FIG. 10 shows a process of forming a silicide after the etching of an insulating film in the method for manufacturing an image sensor. FIGS. 9 and 10 illustrate only the wiring and its surroundings included in a pixel of the image sensor. The other configurations of the pixel are the same as those of a pixel of the conventional image sensor as shown in FIG. 15. The processes before forming the resist pattern and after forming the silicide in the manufacturing method of this embodiment are the same as those in Embodiment 1.

In the manufacturing method for a semiconductor device of this embodiment, as shown in FIG. 9, a resist pattern 10 is formed continuously on an insulating film 8 so as to cover not only a region including a second portion 8b and a portion of the insulating film 8 that is arranged directly above a diffusion layer 16, but also a part of a first portion 8a. In FIG. 9, reference numeral 100 is a semiconductor substrate, 4 is an isolation film, and 1 is wiring of a pixel.

When the alignment accuracy of a photomask used for forming the resist pattern is, e.g., 100 nm, the maximum shift of an edge 10a of the resist pattern 10 from a desired position is 100 nm. In this case, a layout of the resist pattern 10 (photomask) may be designed, e.g., so that a distance 14 between the edge 10a and a side 1a of the wiring 1 near to the diffusion layer 16 is 120 nm, and a distance 15 between a pair of opposite edges 10a is 250 nm.

A width 21 of the wiring 1 is, e.g., 490 nm, which is obtained by adding the distance 15 and twice the distance 14. In the manufacturing method for a semiconductor device of this embodiment, the distance (250 nm) between a pair of edges 10a is the same as the minimum value of a gate width (wiring width) defined by a design rule. Therefore, the width 21 (490 nm), i.e., the sum of the distance 15 and twice the distance 14 is larger than the minimum value of the gate width defined by the design rule.

With this layout, even if the deviation of the photomask (the edge 10a of the resist pattern 10) from a desired position is the maximum (e.g., 100 nm), the edge 10a of the resist pattern 10 is arranged neither directly on the diffusion layer 16 nor on the second portion 8b (stepped portion) that is formed into a sidewall spacer by etching.

In FIG. 9, the width 21 of the wiring 1 is, e.g., 490 nm. However, the manufacturing method for a semiconductor device of this embodiment is not limited thereto. It is preferable that the width 21 of the wiring 1 is not less than the sum of twice the maximum value of deviation of the edge 10a from a desired position and the minimum value of the wiring width defined by the design rule. Moreover, it is preferable that the width 21 of the wiring 1 is not more than a difference obtained by subtracting twice the maximum value of deviation of the edge 10a from a desired position from a width 22 of the isolation film. Specifically, when the minimum value of the wiring width defined by the design rule is, e.g., 250 nm, the maximum value of deviation of the edge 10a from a desired position is, e.g., 80 nm to 120 nm, and the distance 15 between a pair of edges 10a is, e.g., 250 nm, the width 21 of the wiring 1 is preferably 410 nm to 490 nm, and more preferably 450 nm to 530 nm, further allowing for deviation. The wiring width that falls within this range allows the edge 10a to be arranged above the wiring 1, even if the deviation of the photomask from a desired position is the maximum. Thus, it is possible to avoid etching damage to the diffusion layer 16 reliably.

Next, using the resist pattern 10 as a mask, a part of the insulating film 8 is removed by anisotropic dry etching, so that a part of the wiring 1 is exposed, and a sidewall spacer 3 is formed on a side of the wiring 1, as shown in FIG. 10. At the same time as the formation of the sidewall spacer 3, a sidewall spacer 23 (FIG. 8) also is formed in contact with a side of a gate electrode 27 of a transistor 28 in the peripheral circuit region.

Next, as shown in FIG. 10, the surface of the wiring 1 reacts with a refractory metal such as Ti or Co to form a silicide 5. At the same time, a source/drain region of the transistor 28 (FIG. 8) in the peripheral circuit region also reacts with a refractory metal such as Ti or Co to form a silicide. In this case, the insulating film 8 is arranged directly above the diffusion layer 16 of the photodiode and a floating diffusion amplifier 18 (FIG. 8). Therefore, the diffusion layer 16 and the floating diffusion amplifier 18 are not silicided, thereby avoiding damage of the silicidation to them.

In the example described with reference to FIGS. 9 and 10, the distance 15 (FIG. 9) between a pair of edges 10a of the resist pattern 10 is smaller than the width 21 (FIG. 9) of the wiring 1. However, the manufacturing method for a semiconductor device of this embodiment is not limited thereto. Even if the deviation of the photomask from a desired position is the maximum, the distance 15 may be extended, e.g., to about the same length as the width 21 of the wiring 1, as long as each of the edges 10a is arranged on the second portion 8b. As the distance 15 increases, a region where the silicide 5 (FIG. 10) is formed becomes larger, and the resistance of the wiring 1 can be made lower.

FIG. 11 shows a layout of the photomask in which the distance 15 is the same as the width of the wiring 1. In the example as shown in FIG. 11, the alignment deviation of the photomask is the maximum in the right direction of the drawing. In FIG. 11, reference numeral 100 is a semiconductor substrate, 16 is a diffusion layer of a photodiode, and 4 is an isolation film. In this case, the left edge 10a of the resist pattern 10 is arranged on the first portion 8a, and the right edge 10a is arranged on the second portion 8b.

Whether the alignment deviation of the photomask is the maximum in the left or right direction of FIG. 11, the thickness of the insulating film 8, particularly a width L1 of the second portion 8b, may be adjusted so that the resist pattern 10 is formed on the insulating film 8 so as to cover a region including at least a part of the second portion 8b and a portion of the insulating film 8 that is arranged directly above the diffusion layer 16 while avoiding at least a part of a region on the first portion 8a.

Figure 12:
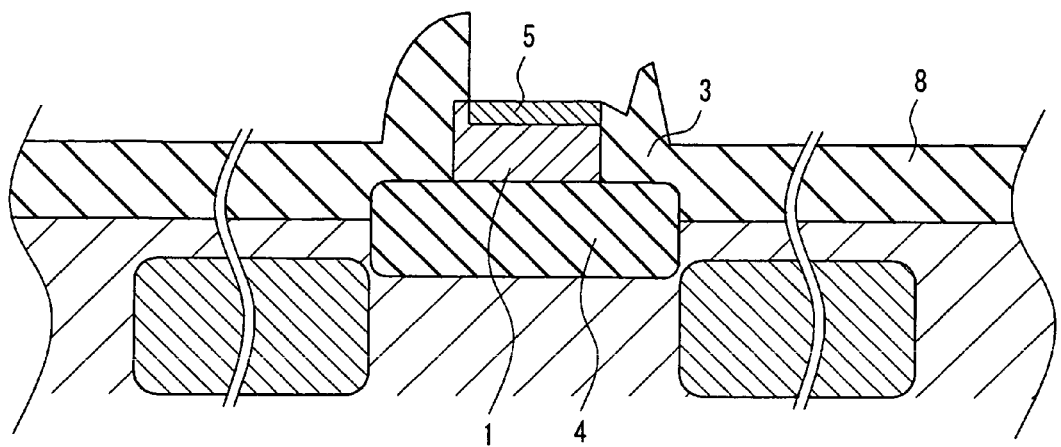
FIG. 12 is a cross-sectional view showing an example of one step in a method for manufacturing a semiconductor device of Embodiment 2.

Next, using the resist pattern 10 as a mask, a part of the insulating film 8 is removed by anisotropic dry etching, so that the wiring 1 is exposed, and a sidewall spacer 3 is formed in contact with a side of the wiring 1, as shown in FIG. 12. At the same time, a sidewall spacer 23 (FIG. 8) also is formed in contact with a side of a gate electrode 27 of a transistor 28 in the peripheral circuit region B. In the manufacturing method for a semiconductor device of this embodiment, the unevenness of the insulating film 8 immediately after forming the sidewall spacer 3 is larger than that in Embodiment 1. However, such unevenness is reduced gradually during surface cleaning that is performed immediately before or after the formation of a silicide 5, and thus is small enough not to cause any problem.

Next, the surface of the wiring 1 reacts with a refractory metal such as Ti or Co to form a silicide 5. At the same time, a source/drain region of the transistor 28 (FIG. 8) in the peripheral circuit region also reacts with a refractory metal such as Ti or Co to form a silicide 5. In this embodiment, a part of the surface of the wiring 1 that faces away from the isolation film 4 is silicided. Accordingly, there are silicided and non-silicided portions on this surface of the wiring 1. Like Embodiment 1, a BPSG film is formed on the insulating film 8 and then is flattened by CMP. The subsequent processes are the same as those in a conventional example.

As described above, in the manufacturing method for a semiconductor device of this embodiment, the resist pattern 10 is formed on the insulating film 8 so as to cover a region including a part of the first portion 8a, the second portion 8b, and a portion of the insulating film 8 that is arranged directly above the diffusion layer 16, as shown in FIG. 11, in the processes of etching the insulating film 8 and exposing a part of the wiring 1. Therefore, e.g., even if the isolation film 4 is formed in a smaller region and the diffusion layer 16 is formed in a larger region of the semiconductor substrate 100, it is possible to avoid etching damage to the diffusion layer 16. Moreover, even if the diffusion layer 16 is located closer to the isolation film 4, it is also possible to avoid etching damage to the diffusion layer 16. Consequently, the miniaturization or high performance of a semiconductor device can be achieved, thus providing, e.g., an image sensor with excellent sensitivity to incident light signals. Further, it is possible to avoid degradation of the characteristics of the diffusion layer 16 caused by silicidation.

In Embodiments 1 and 2, an image sensor is used as an example of the semiconductor device. However, the semiconductor device of the present invention is not limited thereto, and may be, e.g., a MOS system LSI, a semiconductor memory, or the like.

The diffusion layer 16 may be, e.g., a diffusion layer of an input-output circuit of a general semiconductor integrated circuit rather than a diffusion layer of a photodiode. The insulating film 8 may be made of, e.g., SiON or SiN in addition to the silicon oxide film.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
   a semiconductor substrate;
   an isolation film that is provided in one principal surface of the semiconductor substrate;
   wiring that is arranged on the isolation film;
   a diffusion layer that is formed inside the semiconductor substrate and located in a vicinity of the isolation film; and
   an insulating film that covers the diffusion layer completely over the one principal surface of the semiconductor substrate,
   wherein the insulating film covering the diffusion layer completely further covers a portion of the isolation film near to the diffusion layer continuously and comes into contact with a side of the wiring near to the diffusion layer,
   an entire upper surface of the wiring is exposed from the insulating film; and
   a top portion of the insulating film is positioned above the upper surface of the wiring.

2. The semiconductor device according to claim 1, wherein the semiconductor device is an image sensor that comprises an image region with a plurality of pixels and a peripheral circuit region comprising a driving circuit for driving the image region.

3. The semiconductor device according to claim 2, wherein the diffusion layer is a diffusion layer of a photodiode in each of the pixels, and the wiring is wiring in each of the pixels.

4. The semiconductor device according to claim 3, wherein each of the pixels comprises a transfer gate that is provided on the one principal surface of the semiconductor substrate in a vicinity of the diffusion layer, and the insulating film is formed so as to further cover a part of a surface of the transfer gate that faces away from the semiconductor substrate.

5. The semiconductor device according to claim 2, wherein the peripheral circuit region comprises a gate electrode and a sidewall spacer that is formed of the insulating film arranged in contact with a side of the gate electrode.

6. The semiconductor device according to claim 1, wherein the entire upper surface of the wiring that is exposed from the insulating film is silicided.

7. A semiconductor device comprising:
   a semiconductor substrate;
   an isolation film that is provided in one principal surface of the semiconductor substrate;
   wiring that is arranged on the isolation film;
   a diffusion layer that is formed inside the semiconductor substrate and located in a vicinity of the isolation film; and
   an insulating film that covers the diffusion layer completely over the one principal surface of the semiconductor substrate, but does not cover any of an upper surface of the wiring,
   wherein the insulating film covering the diffusion layer completely further covers a portion of the isolation film near to the diffusion layer continuously and comes into contact with an entire side of the wiring near to the diffusion layer, and a top portion of the insulating film is positioned above the upper surface of the wiring.

8. The semiconductor device according to claim 7, wherein the semiconductor device is an image sensor that comprises an image region with a plurality of pixels and a peripheral circuit region comprising a driving circuit for driving the image region.

9. The semiconductor device according to claim 8, wherein the diffusion layer is a diffusion layer of a photodiode in each of the pixels, and the wiring is wiring in each of the pixels.

10. The semiconductor device according to claim 9, wherein each of the pixels comprises a transfer gate that is provided on the one principal surface of the semiconductor substrate in a vicinity of the diffusion layer, and the insulating film is formed so as to further cover a part of a surface of the transfer gate that faces away from the semiconductor substrate.

11. The semiconductor device according to claim 8, wherein the peripheral circuit region comprises a gate electrode and a sidewall spacer that is formed of the insulating film arranged in contact with a side of the gate electrode.

12. The semiconductor device according to claim 7, wherein the entire upper surface of the wiring that is exposed from the insulating film is silicided.

* * * * *